United States Patent [19]
Ashley et al.

[11] Patent Number: 6,154,037
[45] Date of Patent: Nov. 28, 2000

[54] SYSTEM AND METHOD FOR TESTING DISTORTION IN TRANSFORMERS

[75] Inventors: Francis R. Ashley, South Plainfield; Arnold Muralt, Fair Haven, both of N.J.

[73] Assignee: Globespan Semiconductor, Inc., Red Bank, N.J.

[21] Appl. No.: 09/170,753

[22] Filed: Oct. 13, 1998

[51] Int. Cl.$^7$ .................................................. G01R 29/22
[52] U.S. Cl. .......................................... 324/623; 324/727
[58] Field of Search ..................................... 324/623, 726, 324/604, 606, 616, 620, 727, 547

[56] References Cited

U.S. PATENT DOCUMENTS

| | | | |
|---|---|---|---|
| 3,940,703 | 2/1976 | Hekimian et al. | 328/144 |
| 4,467,271 | 8/1984 | Ruckenbauer et al. | 324/727 |
| 4,533,868 | 8/1985 | Fabbri et al. | 324/76.77 |
| 4,613,815 | 9/1986 | Christel | 324/233 |
| 4,725,711 | 2/1988 | Sauerland | 324/727 |
| 5,818,237 | 10/1998 | Zuercher et al. | 324/536 |

*Primary Examiner*—Safet Metjahic
*Assistant Examiner*—Vincent Q. Nguyen
*Attorney, Agent, or Firm*—Thomas, Kayden, Hostemeyer & Risley

[57] ABSTRACT

The present invention entails a circuit and method for determining the distortion created by a transformer used in data communications. The circuit according to the present invention comprises a transmitting circuit, a back matching circuit, and a subtracting circuit. The transmitting circuit generates a test signal to be transmitted into a transformer, the transmitting circuit having a transmitting output for coupling to a transformer. Once applied to the transformer, the test signal is distorted by the transformer, where the transformer creates harmonics of the test signal and other signal distortion. The back matching circuit generates a scaled test signal that is subtracted from the distorted test signal in the subtraction circuit. The result is a diminished peak at the test signal in comparison to the harmonics such that the distortion by the transformer can be determined using a measuring device with a relatively low dynamic range.

12 Claims, 4 Drawing Sheets

SYSTEM AND METHOD FOR TESTING DISTORTION IN TRANSFORMERS

CROSS-REFERENCE TO RELATED APPLICATIONS

Not Applicable.

STATEMENT REGARDING FEDERALLY SPONSORED RESEARCH OR DEVELOPMENT

Not Applicable.

TECHNICAL FIELD

This application relates to the field of distortion testing of transformers, and, more particularly, to the field of distortion testing of transformers used in data communication.

BACKGROUND INFORMATION

It is often the case that transformers are used in data communications transceivers to interface with telecommunications networks. Such transformers are often used to both transmit and receive data signals. Unfortunately, transformers can often cause distortion to such data signals. In particular, transformers will often create harmonics of the data signals and other anomalies.

The creation of distortion by transformers is undesirable because it may interfere with the data signals and cause errors. For example, a received data signal may often have a diminished magnitude and power due to significant attenuation across a relatively long local loop which electrically couples a data communications transceiver to a central office. The distortion caused by a transformer may be of sufficient magnitude to interfere with such diminished data signals, resulting in data errors.

As a consequence, it is desirable to measure the distortion of a transformer accurately to determine the acceptability of a transformer for data communications applications. However, accurate measurement of the distortion caused by transformers presents obstacles. For example, harmonics created by a transformer that cause signal degradation may be up to 90 dB lower than the magnitude of a signal transmitted into the transformer. In addition, noise and distortion existing in typical test signals applied to a transformer are indistinguishable from the signal degradation and noise caused by the tested transformer. As a consequence, it is often necessary that measuring equipment have a significant dynamic range greater or equal to 90 dB to measure the harmonic distortion relative to the transmitted data signal. Generally, measuring equipment with such a dynamic range tends to be quite expensive.

Proposed solutions include the use of various filters to eliminate unwanted noise. For example, noise and distortion created by the test signal source may be filtered out using a band pass filter tuned to the center frequency of the test signal before the signal is passed to a transformer to be tested. In addition, a notch filter may be used to eliminate the sinusoidal test signal allowing only distortion components to pass to an analyzer.

Unfortunately, the proposed solutions have proven to be inadequate. In particular, generally high quality filters are required which increase cost. Further, a unique filter is employed for each test signal frequency used, further driving up cost. In addition, such filters create additional electrical load that should be accounted for in the circuit.

Consequently, there is a need for a testing circuit that reduces the magnitude of a transmitted signal received from a transformer without affecting the harmonics created by the transformer in order to determine the distortion caused by a transformer used in data communications applications.

BRIEF SUMMARY OF THE INVENTION

The present invention entails a circuit and method for determining the distortion created by a transformer. The circuit according to the present invention comprises a transmitting circuit, a back matching circuit, and a subtracting circuit. The transmitting circuit generates a test signal to be transmitted into a transformer, the transmitting circuit having a transmitting output for coupling to a transformer. Once applied to the transformer, the test signal is distorted by the transformer. The distorted test signal comprises an altered test signal at approximately 100 KHz plus harmonics which were generated in the transformer. The back matching circuit generates a scaled test signal at 100 KHz based on a test signal received from the transmitting circuit. Finally, the distorted test signal and the scaled test signal are applied to the subtracting circuit. The difference between these two signals is transmitted from the output of the subtracting circuit to a high pass filter. The output signal of the high pass filter is applied to measuring equipment. The output signal features a diminished peak at the test signal frequency of up to 30 dB. This allows the distortion of the transformer to be determined without a dynamic range of 90 dB or greater.

In accordance with another aspect of the present invention, a method is provided for determining the distortion of a transformer. The method includes the steps of generating a test signal and applying the test signal to a primary winding of a transformer having a predetermined resistive load applied to the secondary winding, thereby creating a distorted test signal. Next the test signal is subtracted from the distorted test signal to obtain an output signal. The output signal is filtered by a high pass filter and then transmitted to a signal processing device for analysis.

The present invention provides distinct advantages in that distortion components of the test signal are suppressed and the test signal frequency itself can be varied arbitrarily. Additionally, no filters are required.

Other features and advantages of the present invention will become apparent to one with skill in the art upon examination of the following drawings and detailed description. It is intended that all such additional features and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

DETAILED DESCRIPTION OF THE INVENTION

Figure 1:
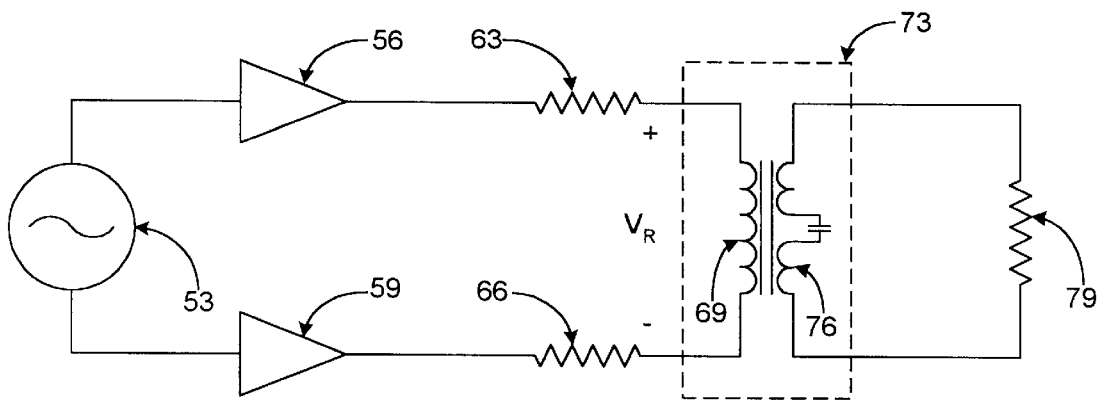
FIG. 1 is a drawing of a conventional transformer testing circuit.

Turning to FIG. 1, shown is a conventional transformer testing circuit 50. The transformer testing circuit 50 includes a signal generator 53 which generates a testing signal which is, for example, a sine wave of approximately 100 KHz The testing signal is applied to first and second line driver amplifiers 56 and 59 which are in a balanced circuit configuration. The outputs of the first and second line driver amplifiers 56 and 59 are electrically coupled to first and second matching resistors 63 and 66. The first and second matching resistors 63 and 66 are in turn electrically coupled to a primary winding 69 of a line driver transformer 73 to be tested. The secondary winding 76 of the line driver transformer 73 is electrically coupled to a resistor 79 which simulates an electrical connection with a central office over a local loop.

To explain the operation of the testing circuit 50, the test signal is applied to the line driver transformer 73 and the resulting voltage $V_R$ across the primary winding 69 of the line driver transformer 73 is measured.

Figure 2:
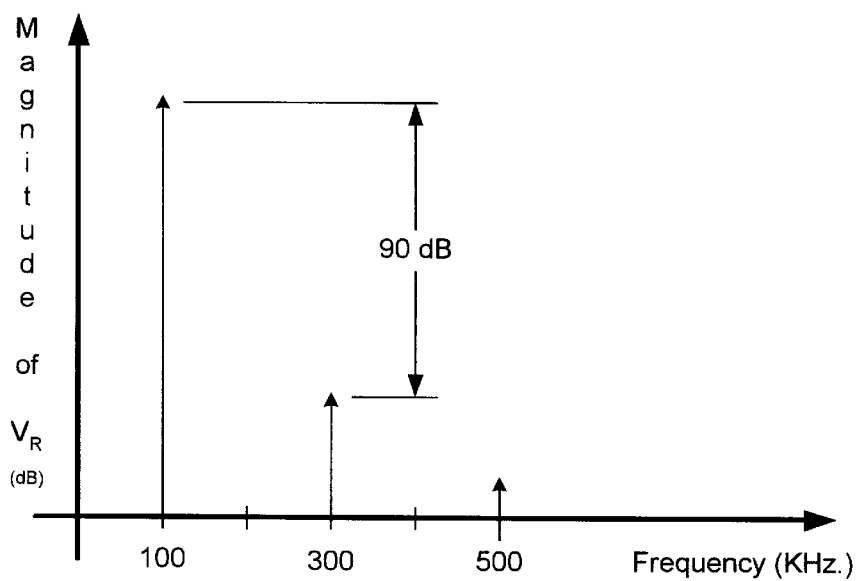
FIG. 2 is a graph of the frequency response of the transformer of FIG. 1.

Referring to FIG. 2, shown is a graph of the frequency response of the resulting voltage $V_R$. At 100 KHz there is a peak from the test signal. Also shown are smaller peaks at 300 KHz and 500 KHz which typically result from the distortion caused by the transformer 73 (FIG. 1). Note that the difference in magnitude between the 100 KHz peak and the 300 KHz peak is approximately 90 dB for a low distortion transformer 73. As previously discussed, this requires more expensive test equipment to evaluate.

Figure 3:
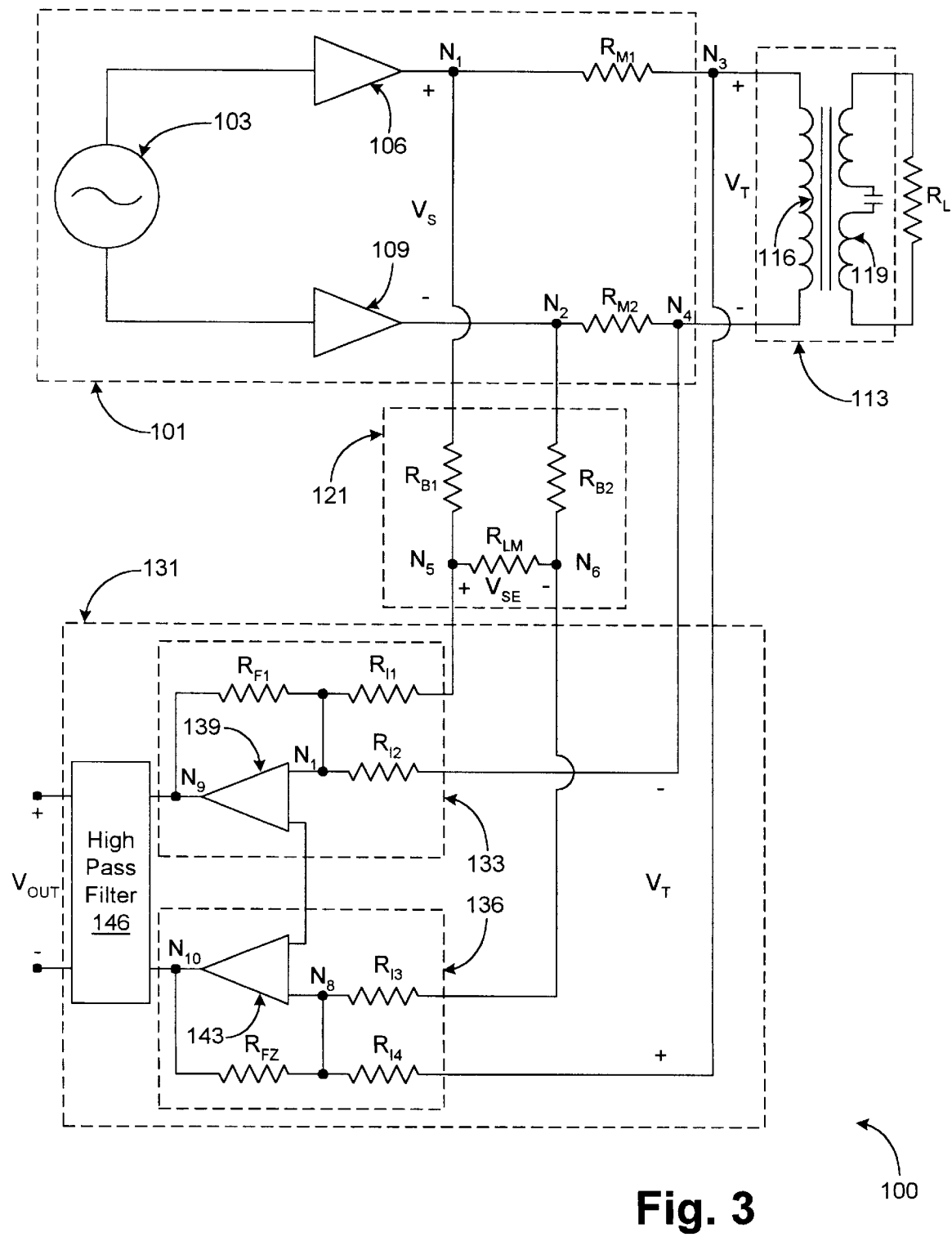
FIG. 3 is a drawing of a first embodiment of the transformer testing circuit according to the present invention.

With reference to FIG. 3, shown is a transformer test circuit 100 according to a first embodiment of the present invention. The test circuit 100 comprises a transmission circuit 101 which includes a signal generator 103 from which a test signal is generated. The terminals of the signal generator 103 are electrically coupled to a first driver amplifier 106 and a second driver amplifier 109 in a balanced circuit configuration. The output of the first driver amplifier 106 is electrically coupled to a first matching resistor $R_{M1}$, at node $N_1$. The output of the second driver amplifier 109 is electrically coupled to a second matching resistor $R_{M2}$ at node $N_2$. The first and second matching resistors $R_{M1}$ and $R_{M2}$ may be, for example, 50 ohms or other appropriate values.

The first and second matching resistors $R_{M1}$ and $R_{M2}$ are designed to be electrically coupled to a transformer 113 which is to be tested for distortion. During testing, the first matching resistor $R_{M1}$ is electrically coupled to a primary winding 116 of the transformer 113 at node $N_3$, and the second matching resistor $R_{M2}$ is electrically coupled to a primary winding 116 of the transformer 113 at node $N_4$. Also, a load resistance $R_L$ is coupled to the secondary winding 119 of the transformer 113.

Next to the transmission circuit 101 is a back matching circuit 121 which includes a first back matching resistor $R_{B1}$, a second back matching resistor $R_{B2}$, and a load matching resistor $R_{LM}$. The first back matching resistor $R_{B1}$ is coupled to the transmission circuit 101 at node $N_1$ and the second back matching resistor $R_{B2}$ is coupled to the transmission circuit 101 at node $N_2$. The first and second back matching resistors $R_{B1}$ and $R_{B2}$ are both electrically coupled to the load matching resistance $R_{LM}$ at nodes $N_5$ and $N_6$.

Finally, shown next to the back matching circuit 121 is a subtraction circuit 131. The subtraction circuit 131 includes a first summing circuit 133 and a second summing circuit 136, also in a balanced circuit configuration. The first summing circuit comprises a first input resistor $R_{I1}$ and a second input resistor $R_{I2}$. The first input resistor $R_{I1}$ electrically couples node $N_5$ to node $N_7$. The second input resistor $R_{I2}$ electrically couples node $N_4$ to node $N_7$. Node $N_7$ is in turn, electrically coupled to an input terminal of a first summing amplifier 139.

In a similar manner, a third input resistor $R_{I3}$ electrically couples node $N_6$ to the input of a second summing amplifier 143 at node $N_8$. Also, a fourth input resistor $R_{I4}$ electrically couples node $N_3$ to the input at node $N_8$. The remaining input terminal on the first and second summing amplifiers 139 and 143 are electrically coupled together as is done in a balanced configuration. The output terminal of the first summing amplifier 139 at node $N_9$ is electrically coupled to the input terminal at node $N_7$ with feedback resistor $R_{F1}$. Also, the output terminal of the second summing amplifier 143 at node $N_{10}$ is electrically coupled to the input terminal at node $N_8$ with feedback resistor $R_{F2}$.

The output of the first and second summing amplifiers 139 and 143 at nodes $N_9$ and $N_{10}$ are electrically coupled to a high pass filter 146. The output of the high pass filter 146 is then applied to measuring devices and is analyzed to determine the distortion of the transformer 113.

Next, the operation of the testing circuit 100 is explained. First the primary winding 116 of a transformer 113 is electrically coupled to the first and second matching resistors $R_{M1}$ and $R_{M2}$ as shown. A test signal is then generated by the signal generated 103 and is applied to the driver amplifiers 106 and 109, resulting in a signal voltage $V_S$ at the output of the driver amplifiers 106 and 109 across nodes $N_1$ and $N_2$. The signal voltage $V_S$ is applied to the primary winding 116 of the transformer 113 across the first and second matching resistors $R_{M1}$ and $R_{M2}$. The transformer 113 causes the distortion of the test signal which creates a transformer voltage $V_T$ across the primary winding 116 at nodes $N_3$ to $N_4$.

Meanwhile, the back matching circuit 121 creates an equivalent signal voltage $V_{SE}$ across the load matching resistor $R_{LM}$. This is done by specifying the ratio of first and second back matching resistors $R_{B1}$ and $R_{B2}$ to $R_{LM}$ to be approximately equal to the ratio of the first and second back matching resistors $R_{M1}$ and $R_{M2}$ to the equivalent resistance presented by the transformer 113 from nodes $N_3$ to $N_4$. In the first embodiment, the first and second matching resistors $R_{M1}$ and $R_{M2}$ are both equal to 50 Ohms. Also, the first and second back matching resistors $R_{B1}$ and $R_{B2}$ are both 500 Ohms and the load matching resistor $R_{LM}$ is 1000 Ohms. The first and second back matching resistors $R_{B1}$ and $R_{B2}$, and the load matching resistor $R_{LM}$ are large in comparison to the first and second matching resistors $R_{M1}$ and $R_{M2}$ to prevent the overloading of the first and second driver amplifiers 106 and 109.

Ideally, the equivalent signal voltage $V_{SE}$ is equal to the test signal portion of the transformer voltage $V_T$, so that when the equivalent signal voltage $V_{SE}$ is subtracted from the transformer voltage $V_T$, the remaining signal is due entirely to the distortion by the transformer 113.

With this in mind, attention is directed to the subtraction circuit 131 in which the equivalent signal voltage $V_{SE}$ is applied to the first input resistor $R_{I1}$ and the third input resistor $R_{I3}$. Additionally, the transformer voltage $V_T$ is applied to the second input resistor $R_{I2}$ and the fourth input resistor $R_{I4}$. Note that the transformer voltage $V_T$ is inverted as compared with the equivalent signal voltage $V_{SE}$. As a result, the balanced summing circuits 133 and 136 subtract $V_D$ from $V_{SE}$, providing the difference at the output of the first and second summing amplifiers 139 and 143 across nodes $N_9$ and $N_{10}$ which is applied to the high pass filter 146. The voltage output $V_{OUT}$ from the high pass filter 146 is then analyzed to determine the distortion caused by the transformer 113. Specifically, the subtraction performed diminishes the magnitude of the test signal at 100 KHz which allows the harmonics created by the transformer 113 to be examined without necessitating a dynamic range of 90 dB or greater, which reduces the cost of the measuring device and increases the accuracy of the distortion measurement. Ideally, the magnitude of the test signal at 100 KHz should be reduced to zero, however, realistically it is reduced by approximately 30 dB in the first embodiment.

Figure 4:
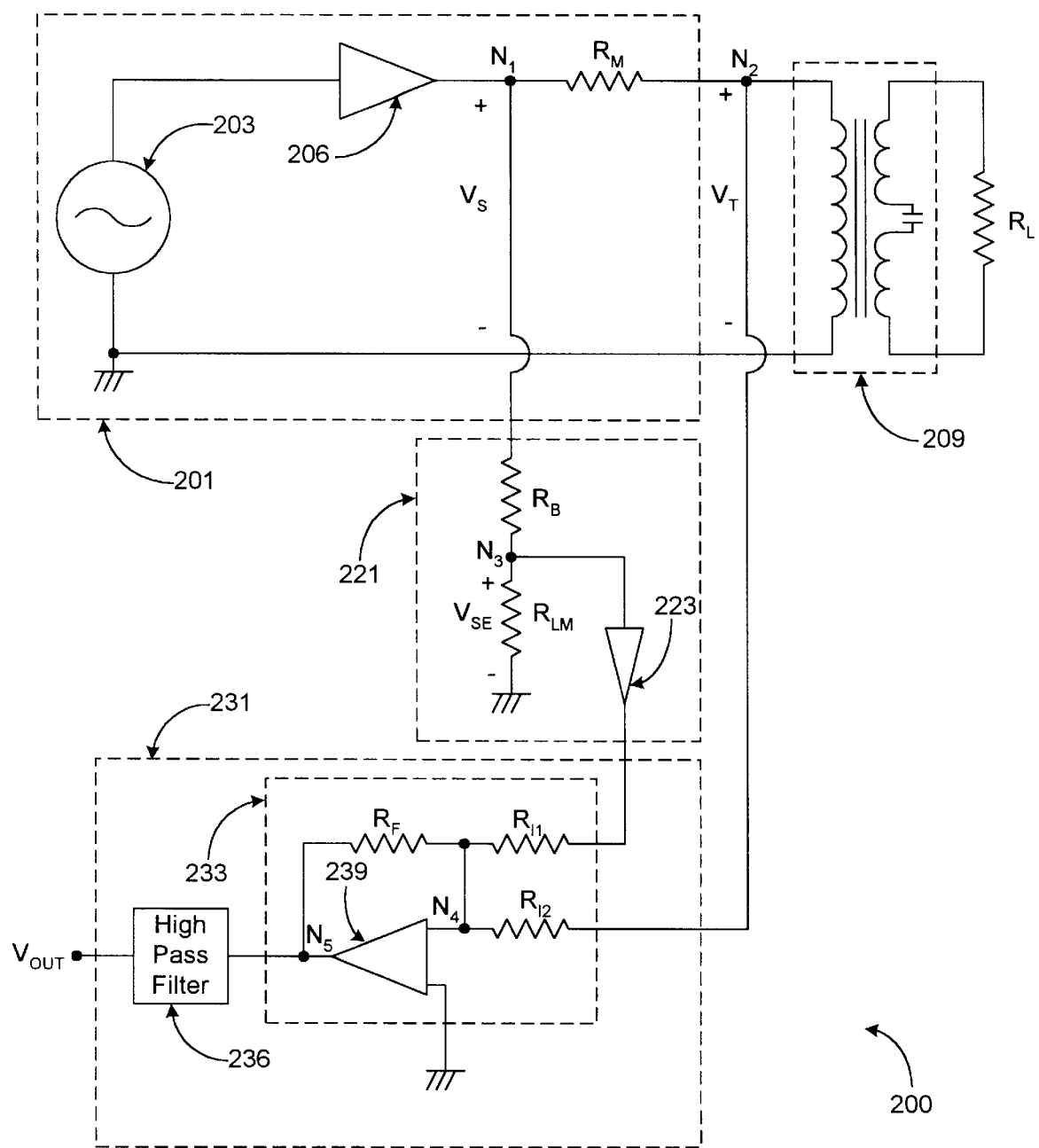
FIG. 4 is a drawing of a second embodiment of the transformer testing circuit according to the present invention.

Turning then, to FIG. 4, shown is a transformer test circuit 200 according to a second embodiment of the present invention. The transformer test circuit 200 is similar to the transformer test circuit 100 (FIG. 3) except that it is not a balanced circuit, but a single sided circuit. The transformer test circuit 200 comprises a transmit circuit 201 which includes a signal generator 203, a driver amplifier 206, and a matching resistor $R_M$ as shown. The output of the signal generator 203 is electrically coupled to the input of the driver amplifier 206. The output of the driver amplifier 206 is electrically coupled to the matching resistor $R_M$ at node $N_1$.

During the testing of a transformer 209 for distortion, the matching resistor $R_M$ which is designed for electrical coupling to a transformer 209 is, in fact, electrically coupled to the transformer 209 at node $N_2$. The matching resistor $R_M$ is electrically coupled to the primary winding 213 of the transformer 209, which in turn is electrically coupled to the signal generator 203. A load resistor $R_L$ is electrically coupled across the secondary winding of the transformer 209.

The transformer test circuit 200 also includes a back matching circuit 221. The back matching circuit 221 comprises a back matching resistor $R_B$, a load matching resistor $R_{LM}$, and an inverter 223. The back matching resistor $R_B$ electrically couples the output of the driver amplifier 206 at node $N_1$ to the load matching resistor $R_M$ and the inverter 223 at node $N_3$. The load matching resistor $R_M$ electrically couples node 3 to ground.

The transformer test circuit 200 further comprises a subtraction circuit 231 which includes a summing circuit 233 and a high pass filter 236. The summing circuit 233 is comprised of a first input resistor $R_{I1}$ and a second input resistor $R_{I2}$. The first input resistor $R_{I1}$ electrically couples the output of the inverter 223 to the input terminal of an summing amplifier 239 at node $N_4$. The second input resistor $R_{I2}$ electrically couples the node $N_2$ to node $N_4$ as well. A feedback resistance $R_F$ electrically couples node $N_4$ to the output of the summing amplifier 239 at node $N_5$. The high pass filter 236 is electrically coupled to node $N_5$ and provides a output to be applied to measuring devices.

Next the operation of the transformer test circuit 200 is explained. The signal generator 203 transmits a test signal, which is preferably a 100 KHz sine wave, to the driver amplifier 206. The driver amplifier 206 outputs an amplified signal voltage $V_S$, which in turn is applied to the transformer 209 through the matching resistor $R_M$. The result is a transformer signal voltage $V_T$ across the primary winding of the transformer 209 which comprises the amplified signal voltage $V_s$ as distorted by the transformer 209. The transformer signal voltage $V_T$ is applied to the summing circuit 233.

The amplified signal voltage $V_S$ is also applied to the back matching circuit. The back matching resistor $R_B$ and the load matching resistance are specified so that a resistance ratio exists such that an equivalent signal voltage $V_{SE}$ results across the load matching resistor $R_{LM}$ that equals the signal voltage component of the transformer signal voltage $V_T$. The equivalent signal voltage $V_{SE}$ is inverted by the inverter 223 and then applied to the summing circuit 233 along with the transformer signal voltage $V_T$.

In the summing circuit, the inverted equivalent signal voltage $V_{SE}$ and the transformer signal voltage $V_T$ are added, resulting in an output at node $N_5$ which, ideally, comprises the distortion caused by the transformer 209. However, in reality, the 100 KHz component which is reduced by approximately 30 dB as was the case with the first embodiment. This output is applied to the high pass filter 236 and an output voltage $V_{OUT}$ is obtained to be applied to measuring equipment.

Figure 5:
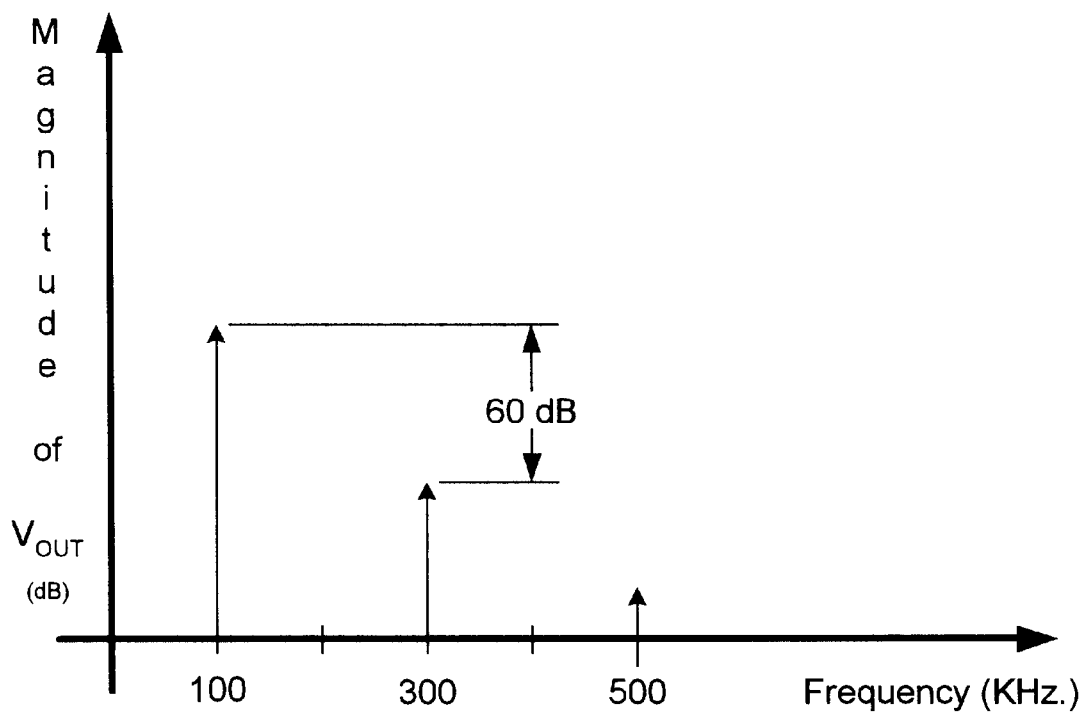
FIG. 5 is a graph of the frequency response of the output voltage of the transformer testing circuits of FIGS. 3 and 4.

Turning to FIG. 5, shown is a graph of the $V_{OUT}$ of FIGS. 3 and 4. Note that the magnitude of the peak at 100 KHz has been reduced by 30 dB as previously discussed as compared to the graph of FIG. 2.

Many variations and modifications may be made to the preferred embodiment of the invention without departing substantially from the spirit and principles of the invention. All such modifications and variations are intended to be included herein within the scope of the present invention, as defined by the following claims.

Having thus described the invention, it is claimed:

1. A circuit for measuring distortion in a transformer, comprising:

a signal generator;

a driver amplifier coupled to the signal generator, the driver amplifier having a driver output;

a matching resistor having a first end coupled to the driver output and a second end defining a transmission output to be coupled to a transformer;

a back matching resistor electrically coupled to the driver output and a load matching resistor, wherein a scaled signal output is defined at the coupling of the back and load matching resistors;

an inverter coupled to the scaled signal output; and a summing circuit having a first input, a second input, and a summing output, the first input being electrically coupled to the inverter, and, the second input being coupled to the transmission output.

2. The circuit of claim 1, wherein:

a test signal is generated at the transmission output;

a scaled test signal is generated at the scaled signal output; and an output signal is generated at the summing output, the summing circuit generating the output signal by subtracting the scaled test signal from the test signal.

3. The circuit of claim 1, further comprising a high pass filter electrically coupled to the summing output.

4. A circuit for measuring distortion in a transformer, comprising:

a signal generator;

a pair of driver amplifiers coupled to the signal generator, each of the driver amplifiers having a signal output;

a pair of matching resistors, each matching resistor having a first end coupled to one of the signal outputs and a second end, the second ends of the matching resistors defining a transmission output to be coupled to a transformer;

a pair of first back matching resistors, each of the matching resistors having a first back matching end and a second back matching end, the first back matching ends being electrically coupled to the signal outputs, respectively;

a load matching resistor electrically coupled to the second back matching ends; and a pair of summing circuits, each of the summing circuits having a first input, a second input and a summing output, the first inputs being electrically coupled to a respective end of the load matching resistor, and, the second inputs being coupled the second ends of the matching resistors, respectively.

5. The circuit of claim 4, wherein:

a test signal is generated at the transmission output;

a scaled test signal is generated across the load matching resistor; and an output signal is generated across the summing outputs, the summing circuits generating the output signal by subtracting the scaled test signal from the test signal.

6. The circuit of claim 4, further comprising a high pass filter electrically coupled to the summing outputs.

7. A circuit for determining distortion in a transformer, comprising:

a transmitting means for generating a test signal to be transmitted into a transformer, the transmitting means having a transmitting output for coupling to a transformer;

a back matching means for generating a scaled test signal, the back matching means being electrically coupled to the transmitting means; and a subtracting means for generating a subtracted test signal by subtracting the scaled test signal from the test signal at the transmitting output, the receiving means being electrically coupled to the back matching means and the transmitting output.

8. The circuit of claim 7, wherein the transmitting means further comprises:

a signal generator having a signal output;

at least one line drive amplifier having an amplified output, the line drive amplifier being electrically coupled to the signal output; and at least one matching resistor electrically coupled to the amplified output, the matching resistor defining the transmitting output.

9. The circuit of claim 8, wherein the matching means further comprises:

at least one back matching resistor coupled to the output of the line drive amplifier; and a load matching resistor coupled to the back matching resistor, wherein the scaled test signal is generated across the load matching resistor.

10. The circuit of claim 9, wherein the receiving means further comprises:

at least one summing circuit having a first input coupled to the transmitting output and a second input coupled to the load matching resistor, the summing circuit having a summed signal output; and a high pass filter coupled to the summed signal output.

11. A method for determining distortion in a transformer, comprising the steps of:

generating a test signal;

applying the test signal to a primary winding of a transformer having a predetermined resistive load applied to the secondary winding, thereby creating a distorted test signal;

subtracting the test signal from the distorted test signal to obtain an output signal;

transmitting the output signal to a signal processing apparatus for analysis.

12. The system of claim 11, further comprising the step of filtering the output signal with a high pass filter.

* * * * *